United States Patent
Tetz et al.

(10) Patent No.: US 11,075,319 B2
(45) Date of Patent: Jul. 27, 2021

(54) MICROELECTRONIC WORKPIECE PROCESSING SYSTEMS AND ASSOCIATED METHODS OF COLOR CORRECTION

(71) Applicant: Micron Technology, Inc., Boise, ID (US)

(72) Inventors: Kevin Tetz, Boise, ID (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 16/434,956

(22) Filed: Jun. 7, 2019

(65) Prior Publication Data

US 2019/0296183 A1 Sep. 26, 2019

Related U.S. Application Data

(62) Division of application No. 14/269,348, filed on May 5, 2014, now Pat. No. 10,319,875, which is a division of application No. 12/715,820, filed on Mar. 2, 2010, now Pat. No. 8,716,038.

(51) Int. Cl.
*H01L 33/00* (2010.01)
*B05C 11/00* (2006.01)

(52) U.S. Cl.
CPC ............ *H01L 33/005* (2013.01); *B05C 11/00* (2013.01)

(58) Field of Classification Search
CPC ................. B05C 11/00; H01L 33/005; H01L 2224/48091; H01L 2924/181; H01L 2924/00012; H01L 2924/00014; H01L 2224/97; H01L 27/156; H01L 2933/0041; H01L 33/0095; H01L 33/502; H01L 33/52

USPC .......................................................... 257/79
See application file for complete search history.

(56) References Cited

U.S. PATENT DOCUMENTS

| 4,812,856 A | 3/1989 | Wallace |
| 6,787,987 B2 | 9/2004 | Duineveld et al. |
| 6,861,012 B2 | 3/2005 | Gardner et al. |
| 7,192,474 B2 | 3/2007 | Auslander et al. |
| 2004/0196318 A1 | 10/2004 | Su et al. |
| 2004/0238837 A1* | 12/2004 | Jacob ...................... H01L 33/46 257/99 |

(Continued)

FOREIGN PATENT DOCUMENTS

JP 11046019 2/1999

OTHER PUBLICATIONS

"Chang, Shun-Chi et al., Dual-color light-emitting pixels processed by hybrid inkjet printing, Applied Physics Letters, vol. 73, No. 18, pp. 2561-2563, Nov. 2, 1998."

(Continued)

*Primary Examiner* — Duy T Nguyen
(74) *Attorney, Agent, or Firm* — Perkins Coie LLP

(57) ABSTRACT

Several embodiments of semiconductor systems and associated methods of color corrections are disclosed herein. In one embodiment, a method for producing a light emitting diode (LED) includes forming an (LED) on a substrate, measuring a base emission characteristic of the formed LED, and selecting a phosphor based on the measured base emission characteristic of the formed LED such that a combined emission from the LED and the phosphor at least approximates white light. The method further includes introducing the selected phosphor onto the LED via, for example, inkjet printing.

21 Claims, 9 Drawing Sheets

(56) References Cited

U.S. PATENT DOCUMENTS

| | | |
|---|---|---|
| 2006/0226759 A1* | 10/2006 | Masuda ................ H01L 33/504 |
| | | 313/486 |
| 2007/0111344 A1 | 5/2007 | Leising et al. |
| 2008/0173884 A1 | 7/2008 | Chitnis et al. |
| 2008/0198573 A1 | 8/2008 | Justel et al. |
| 2009/0117672 A1 | 5/2009 | Caruso et al. |
| 2009/0246895 A1 | 10/2009 | You et al. |
| 2009/0286335 A1 | 11/2009 | Le Toquin |
| 2010/0002440 A1* | 1/2010 | Negley ..................... F21K 9/00 |
| | | 362/249.14 |
| 2010/0117516 A1 | 5/2010 | Shimizu et al. |
| 2010/0155750 A1 | 6/2010 | Donofrio |
| 2011/0103089 A1 | 5/2011 | Park et al. |
| 2011/0180829 A1 | 7/2011 | Cho et al. |
| 2011/0217794 A1 | 9/2011 | Tetz et al. |

OTHER PUBLICATIONS

"Morgan, N.N. et al., InGaN Based Light Emitting Diode and Laser Diode—The Present and the Future, Journal of Microwaves and Optoelectronics, vol. 2, No. 5, pp. 52-59, Jul. 2002, ISSN 1516-7399."

* cited by examiner

MICROELECTRONIC WORKPIECE PROCESSING SYSTEMS AND ASSOCIATED METHODS OF COLOR CORRECTION

CROSS-REFERENCE TO RELATED APPLICATIONS

This application is a divisional of U.S. patent application Ser. No. 14/269,348, filed May 5, 2014, now U.S. Pat. No. 10,319,875; which is a divisional of U.S. patent application Ser. No. 12/715,820, filed Mar. 2, 2010, now U.S. Pat. No. 8,716,038; each of which is incorporated herein by reference in its entirety.

TECHNICAL FIELD

The present disclosure is related to microelectronic workpiece processing systems and associated methods of color correction.

BACKGROUND

Mobile phones, personal digital assistants (PDA), digital cameras, MP3 players, and other portable electronic devices utilize white light LEDs for background illumination. White light LEDs can also be used in general lighting, architectural, outdoor, commercial, and/or residential illumination. However, true white light LEDs are not available because LEDs typically only emit at one particular wavelength. For human eyes to perceive the color white, a mixture of wavelengths are needed.

One conventional technique for emulating white light with LEDs includes depositing a converter material (e.g., a phosphor) on an InGaN base material. In operation, the InGaN base material emits a blue light that stimulates the converter material to emit a yellow, green, orange, amber, or red light. The combination of the emissions from both the LEDs and the converter material would appear white to human eyes if matched appropriately. If not matched appropriately, however, the combined emissions would appear off white and may reduce color fidelity of electronic devices. Accordingly, several improvements in color matching/correction may be desirable.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Various embodiments of systems for processing microelectronic workpieces and associated LED color correction methods are described below. The term "microelectronic workpiece" is used throughout to include substrates upon which and/or in which microelectronic devices, micromechanical devices, data storage elements, read/write components, and other features are fabricated. The term "phosphor" generally refers to a material that can sustain glowing after exposure to energized particles (e.g., electrons and/or photons). A person skilled in the relevant art will also understand that the technology may have additional embodiments and that the technology may be practiced without several of the details of the embodiments described below with reference to FIGS. 1-8.

Figure 1:
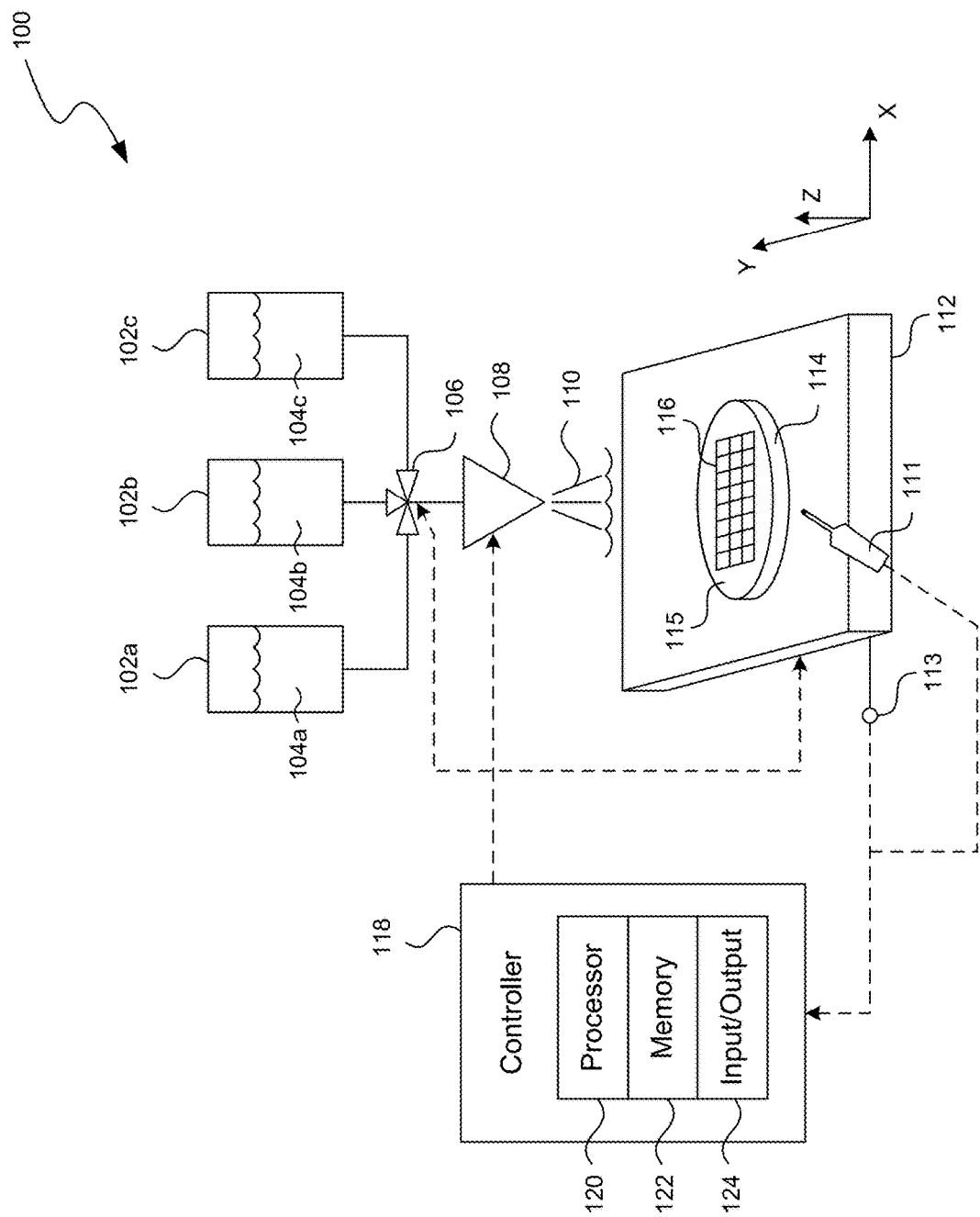
FIG. 1 is a schematic diagram of a microelectronic workpiece processing system in accordance with embodiments of the technology.

FIG. 1 is a schematic view of a microelectronic workpiece processing system 100 in accordance with embodiments of the technology. In the embodiment illustrated in FIG. 1, the system 100 includes a plurality of containers 102 (identified individually as first, second, and third containers 102a, 102b, and 102c, respectively), a mixer 106, an injector 108, and a substrate support 112 arranged in series. Although three containers 102a-c are shown, any suitable number of containers may be used. The system 100 can also include a probe 111 and a controller 118 operatively coupled to the various components of the system 100 for monitoring and/or controlling the operation of these components. In other embodiments, the system 100 can also include a substrate transport station, a structural support (e.g., an hermetically sealed enclosure), a support actuator (e.g., an electric motor), and/or other suitable mechanical and/or electrical components.

The containers 102 can be configured to individually contain a converter material 104 (identified individually as first, second, and third converter materials 104a, 104b, and 104c, respectively). Any suitable number of converter materials 104 can be used. The converter material 104 can have a composition that emits at a desired wavelength under stimulation. For example, in one embodiment, the converter materials 104 can include a phosphor containing Cerium (III)-doped Yttrium Aluminum Garnet ("YAG") at a particular concentration. Such a converter material 104 can emit a broad range of colors from green to yellow and to red under photoluminescence. In other embodiments, the converter material 104 can include Neodymium-doped YAG, Neodymium-Chromium double-doped YAG, Erbium-doped YAG, Ytterbium-doped YAG, Neodymium-cerium double-doped YAG, Holmium-chromium-thulium triple-doped YAG, Thulium-doped YAG, Chromium(IV)-doped YAG, Dysprosium-doped YAG, Samarium-doped YAG, Terbium-doped YAG, and/or other suitable phosphor compositions. In yet other embodiments, the converter material 104 can include Europium phosphors (e.g., CaS:Eu, CaAlSiN$_3$:Eu, Sr$_2$Si$_5$N$_8$:Eu, SrS:Eu, Ba$_2$Si$_5$N$_8$:Eu, Sr$_2$SiO$_4$:Eu, SrSi$_2$N$_2$O$_2$:Eu, SrGa$_2$S$_4$:Eu, SrAl$_2$O$_4$:Eu, Ba$_2$SiO$_4$:Eu, $Sr_4Al_{14}O_{25}$:Eu, SrSiAl$_2$O$_3$N:Eu, BaMgAl$_{10}$O$_{17}$:Eu, Sr$_2$P$_2$O$_7$:Eu, BaSO$_4$:Eu, and/or SrB$_4$O$_7$:Eu).

The mixer 106 can be configured to regulate the concentration or flow rate of at least one of the first, second, and third converter materials 104a, 104b, and 104c from the corresponding containers 102 at a specified ratio. For example, in the illustrated embodiment, the mixer 106 includes a three-way valve that may be actuated based on the specified ratio. In other examples, the mixer 106 can include three individual valves at the discharge of the containers 102, a static mixer, and/or other suitable mixing devices to proportionally combine the converter materials 104a, 104b, and 104c based on the specified ratio.

The injector 108 can be configured to inject, apply, and/or otherwise introduce a volume 110 of a combination of the converter materials 104 from the mixer 106 to an array of microelectronic devices 116 on a microelectronic workpiece 114. The microelectronic devices 116 can individually include an InGaN and/or other types of LED, transistors, capacitors, color filters, mirrors, and/or other suitable types of electrical/mechanical components. In one embodiment, the injector 108 can include a nozzle. In other embodiments, the injector 108 can include a heated steam chamber, a piezoelectric container, and/or other suitable injection elements.

Even though the system 100 shown in FIG. 1 includes the containers 102, the mixer 106, and the injector 108, in certain embodiments, at least some of the foregoing components may be omitted and/or integrated with other components. For example, in certain embodiments, the mixer 106 may be omitted, and the injector 108 may include, for example, a vortex chamber configured to mix the converter materials 104 before injection. In other examples, instead of having a vortex chamber in the injector 108, the injector 108 may instead inject a pattern of dots/pixels and/or layers of the individual converter materials 104 onto the microelectronic device 116. In yet other examples, all of the foregoing components may be integrated into a unitary subassembly.

The substrate support 112 can be configured to carry the microelectronic workpiece 114. The substrate support 112 can include a vacuum chuck, a mechanical chuck, and/or other suitable supporting device. In the illustrated embodiment, the system 100 includes at least one actuator (not shown) configured to move the substrate support 112 laterally (as indicated by the X-axis), transversely (as indicated by the Y-axis), and/or vertically (as indicated by the Z-axis) relative to the injector 108 and/or other components of the system 100. In certain embodiments, the substrate support 112 can also include a position transmitter 113 configured to monitor the position of the substrate support 112 along the X-axis, Y-axis, and/or the Z-axis. Even though only one substrate support 112 is shown in FIG. 1, in certain embodiments, the system 100 can include two, three, or any desired number of substrate supports with structures and/or functions that are generally similar to or different than the substrate support 112. In other embodiments, the system 100 may include an actuator configured to move the injector 108 relative to the microelectronic device 116.

The probe 111 can be configured to test the microelectronic devices 116 on the microelectronic workpiece 114. In one embodiment, the microelectronic devices 116 include InGaN LEDs, and the probe 111 can include a pair of electrodes and/or a light source (not shown) operatively coupled to a spectrometer (not shown). The pair of electrodes and/or light source can provide a stimulation (e.g., an electrical signal or a light) to the individual LEDs. The spectrometer can then measure a wavelength, a frequency, an intensity, and/or other electroluminescence and/or photoluminescence spectral power density and corresponding chromaticity parameters of the InGaN LEDs. In other embodiments, the probe 111 may include other types of electromagnetic emission detecting components.

The controller 118 can include a processor 120 coupled to a memory 122 and an input/output component 124. The processor 120 can include a microprocessor, a field-programmable gate array, and/or other suitable logic devices. The memory 122 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the system 100 via a communication link (e.g., a USB link, an Ethernet link, a Bluetooth link, etc.) In other embodiments, the controller 118 can include a network server operatively coupled to the other components of the system 100 via a network connection (e.g., an Internet connection, an intranet connection, etc.) In further embodiments, the controller 118 can include a process logic controller, a distributed control system, and/or other suitable computing frameworks.

In operation, the system 100 can first receive a batch of microelectronic workpieces 114 in a substrate transport station (not shown) and/or other suitable substrate holding device. The batch can include any desired number of microelectronic workpieces 114, such as 15 or 25. The individual microelectronic workpieces 114 can have the microelectronic devices 116 (e.g., InGaN LEDs) already formed thereon. One technique for forming the InGaN LEDs can include sequentially depositing N-doped GaN, InGaN, and P-doped GaN materials on a sapphire (Al$_2$O$_3$), silicon carbide (SiC), silicon (Si), and/or other suitable substrate via epitaxial growth in a metal organic chemical vapor deposition (MOCVD) process. A first microelectronic workpiece 114 is loaded onto the substrate support 112, and the system 100 can then introduce a converter material onto the individual microelectronic devices 116 of the microelectronic workpiece 114.

In certain embodiments, the system 100 can inject a volume of the converter material onto the individual microelectronic devices 116 of the microelectronic workpiece 114 in a step mode. For example, the controller 118 can energize the actuator(s) to move the substrate support 112 and/or the injector 108 a discrete distance (referred hereinafter to as a "step") along the X-axis or the Y-axis. Once the microelectronic device 116 is in position, the injector 108 introduces a volume of the converter material 104. The injector 108 is then turned off, and the controller 118 energizes the actuator(s) and/or the injector 108 to move the substrate support 112 relative to the injector 108 another step along either the X-axis or the Y-axis. The injector 108 then introduces a volume of the converter material 104 to a subsequent microelectronic device 116 in a similar fashion, and this process is repeated until all of the microelectronic devices 116 are processed.

In other embodiments, the controller 118 can operate the system 100 in a scanning mode. For example, the controller 118 can control the actuators to move the substrate support 112 and/or the injector 108 continuously along the X-axis or the Y-axis at a preselected speed in a first direction or a second direction opposite the first direction. As the microelectronic devices 116 move along the X-axis or the Y-axis, the injector 108 introduces a volume of the converter material 104 onto the individual microelectronic devices 116. In further embodiments, the controller 118 can cause the system 100 to operate in a combination of the step mode and scanning mode.

After all the microelectronic devices 116 on the first microelectronic workpiece 114 are processed, the first microelectronic workpiece 114 can be removed from the substrate support 112 and undergo polishing, cleaning, and/or other suitable processing. A second microelectronic workpiece 114 can then be loaded onto the substrate support 112 from the batch, and the foregoing procedures can be repeated until at least some of the microelectronic workpieces 114 in the batch are processed.

One challenge of manufacturing the microelectronic devices 116 is that the injected converter material 104 may not adequately account for variances in the microelectronic devices 116. For example, it has been recognized that processing variances in epitaxial growth, chemical-mechanical polishing, wet etching, and/or other operations during formation of the microelectronic devices 116 on the same microelectronic workpiece 114 may cause the InGaN LEDs to emit at different wavelengths. As a result, if the applied converter material 104 to the array of microelectronic devices 116 remains unchanged for the entire microelectronic workpiece 114, the combined emission from at least some of the InGaN LEDs and the converter material 104 may be off white (e.g., tinted to red, blue, and/or green).

Embodiments of a method that can address the foregoing emission variations in the InGaN LEDs may be implemented in several embodiments of the system 100. As discussed in more detail below, embodiments of the method can include (1) measuring and developing a map of the emission characteristics of the InGaN LEDs in the individual microelectronic devices 116 of the microelectronic workpiece 114; (2) developing a recipe of the converter materials 104 based on the measured emission of the individual InGaN LEDs; and (3) adjusting and introducing the converter material 104 to the individual microelectronic devices 116 based on the recipe.

During an initial processing stage, an operator can measure the emission characteristics of the InGaN LEDs in the individual microelectronic devices 116 of the microelectronic workpiece 114. The operator may use the probe 111 and/or a stand-alone electroluminescence and/or photoluminescence probe. The operator can then store the measured emission characteristics as a map in the memory 122. In one embodiment, the operator may measure the emission characteristics of every single InGaN LEDs in the individual microelectronic devices 116. In other embodiments, the operator may measure the emission characteristics of selected InGaN LEDs as representative for a region of the individual microelectronic devices 116. In further embodiments, measured emission characteristics may be averaged, filtered, and/or otherwise manipulated to derive a value as representative for a region of the individual microelectronic devices 116.

Figure 2:
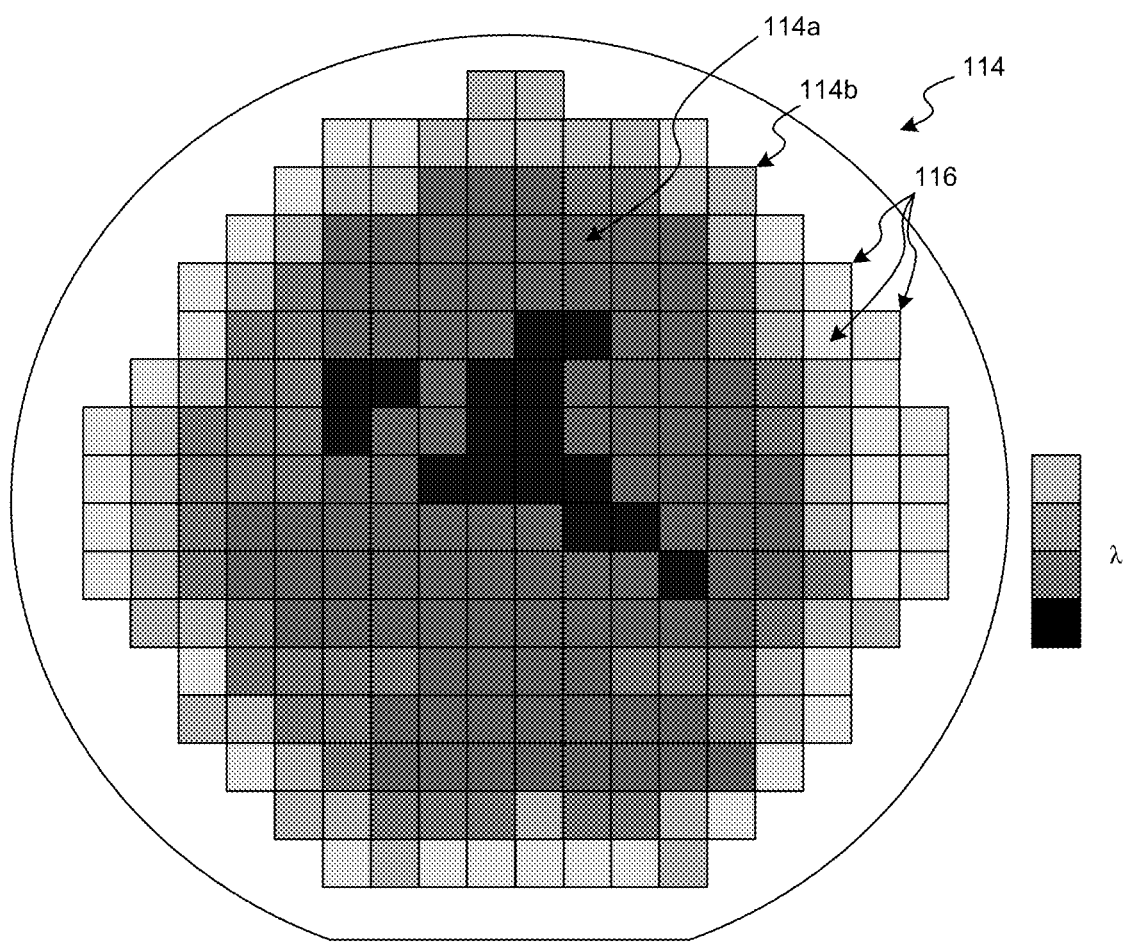
FIG. 2 illustrates InGaN emission variances of a microelectronic workpiece in accordance with embodiments of the technology.

FIG. 2 illustrates a plot showing an example of InGaN emission variances of the microelectronic workpiece 114 in accordance with embodiments of the technology. In the illustrated embodiment, the emission characteristic shown includes the emission wavelength (λ) for illustration purposes. In other embodiments, other emission characteristics may also be used. The microelectronic workpiece 114 may emit over a range of wavelengths. As used hereinafter, the emission wavelength may be quantified as the peak wavelength, the dominant wavelength, or other suitable quantified wavelength. As shown in FIG. 2, significant variations exist for at least some of these emission wavelengths from different regions on the microelectronic workpiece 114 (as represented by the different shades). For example, the InGaN LEDs in the central region 114a appear to emit a first wavelength ($\lambda_1$), and those in the peripheral region 114b appear to emit at a second wavelength ($\lambda_2$) different than the first wavelength.

In certain embodiments, the operator and/or the system 100 may develop mathematical models that correspond to the emission variances. For example, the emission variances may be best fitted to second-order polynomials using regression to yield a plurality of mathematical models. In other embodiments, the operator and/or the system 100 may fit the emission variances to linear polynomials, third-order polynomials, or any other desired order of polynomials. In further embodiments, the operator and/or the system 100 may also fit the emission variances to conic functions (e.g., circular, elliptical, parabolic, and/or hyperbolic arc functions), trigonometric functions (e.g., sine and cosine functions), and/or other desired functions.

Figure 3A:
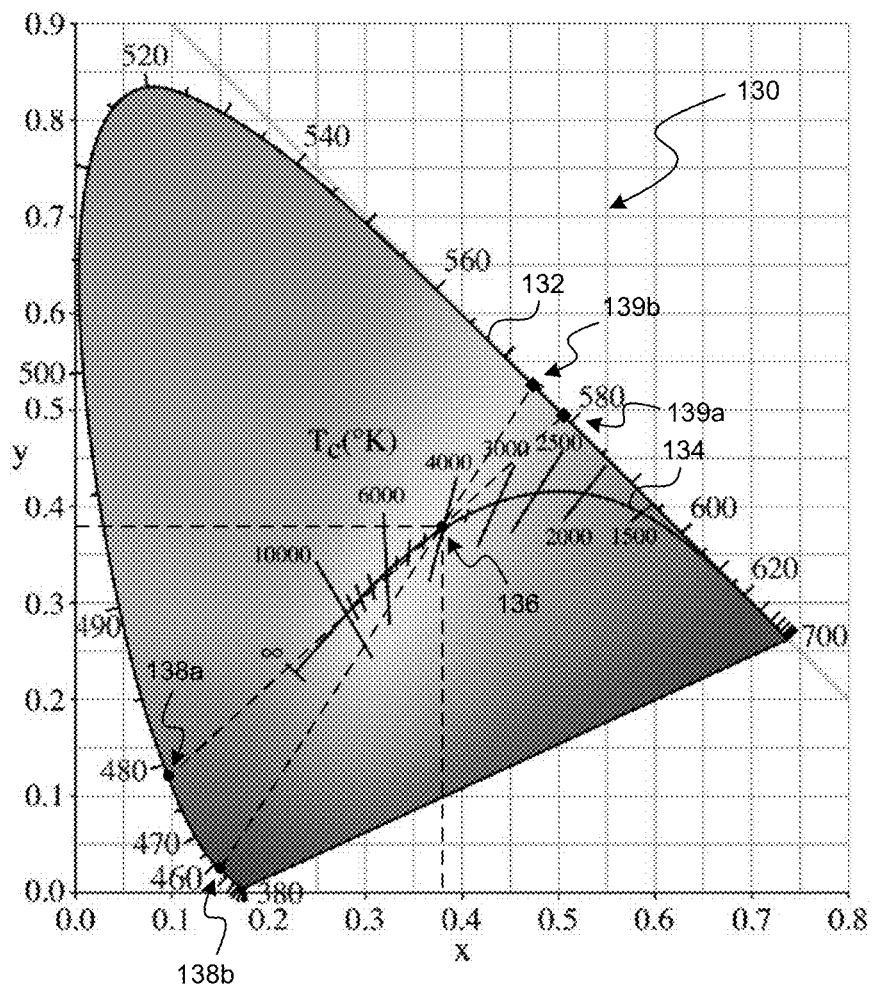
FIGS. 3A and 3B are chromaticity plots of examples of combined emission from an InGaN LED and phosphor(s) in accordance with embodiments of the technology.
Figure 3B:
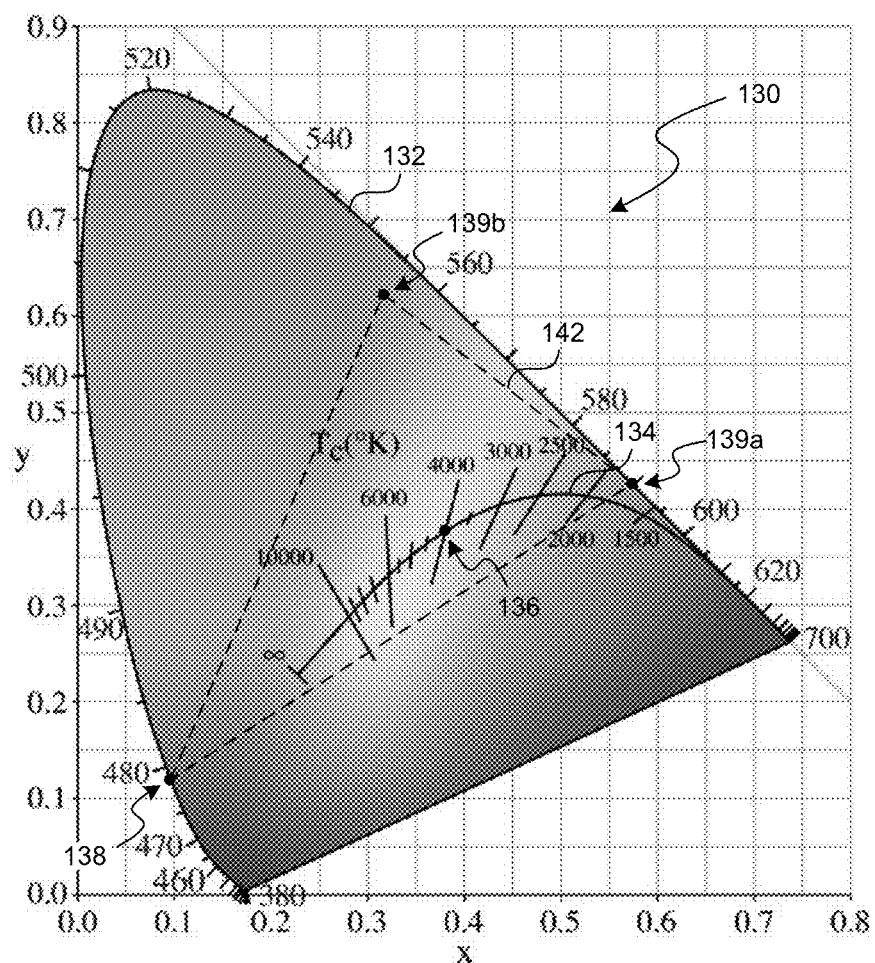

Based on the emission variances shown in FIG. 2, the operator can develop a recipe for the converter materials 104 based on the measured emission of the individual InGaN LEDs. FIGS. 3A and 3B contain chromaticity plots of examples of combined emissions from an InGaN LED and phosphor(s) selected based on the measured emission of the InGaN LEDs in accordance with embodiments of the technology. For illustration purposes, the chromaticity plots are based on International Commission on Illumination (CIE) 1931 color space, though other types of color spaces (e.g., RGB color space) may also be used. In FIG. 3A, one phosphor is illustrated, and in FIG. 3B, two phosphors are illustrated. In other embodiments, three, four, or any other desired number of phosphors may be used.

As shown in FIGS. 3A and 3B, the chromaticity plot 130 includes a generally parabolic curve (commonly referred to as the spectral locus 132) and a black body curve 134 inside the spectral locus 132. The black body curve 134 may be defined by the Planck's law as follows:

$$I(v, T)dv = \left(\frac{2hv^3}{c^2}\right)\frac{1}{e^{\frac{hv}{kT}} - 1}dv$$

where I(v,T)dv is an amount of energy emitted in the frequency range between v and v+dv by a black body at temperature T; h is the Planck constant; c is the speed of light in a vacuum; k is the Boltzmann constant; and v is the frequency of electromagnetic radiation.

Without being bound by theory, it is believed that an average observer perceives the color white when the (x, y) color coordinates of an emission fall on or at least in the vicinity of the black body curve 134 for a given temperature range (e.g., 2,000K to about 10,000K). It is also believed that if one chooses any two points of color on the chromaticity plot 130, then all the colors that lie in a straight line between the two points can be formed or at least approximated by mixing these two colors. Also, all colors that can be formed or at least approximated by mixing three sources are found inside a triangle formed by the source points on the chromaticity plot 130.

Based on the foregoing understanding, the operator and/or the system 100 (FIG. 1) can then select a converter material 104 to at least approximately match the emission of the individual InGaN LEDs. One example of using a single converter material 104 is shown in FIG. 3A. As shown in FIG. 3A, a first InGaN LED has a first emission peak 138a at least proximate to about 478 nm on the spectra locus 132. If the InGaN LED operates at about 4,000° K, an average person would perceive white at a black body emission point 136 of about (0.38, 0.38) on the chromaticity plot 130. Thus, for the first InGaN LED, drawing a line between the emission peak 138a and the black body emission point 136 would yield a converter wavelength of about 579 nm. As a result, if a converter material 104 that emits at a wavelength of 579 nm is deposited on this portion of the microelectronic workpiece 114, the resulting emission would be close to or at least approximates true white light based on the black body curve 134. For a second InGaN LED with a second emission peak 138b of about 456 nm, however, would require a second converter wavelength 139b of about 586 nm. As a result, the operator and/or the system 100 may select appropriate converter materials 104 for corresponding areas of the microelectronic workpiece 114 based at least in part on the measured InGaN LEDs emissions such that the combined emissions are closer to the white light emissions of the black body curve 134 than without the converter materials 104.

FIG. 3B illustrates another example of using two converter materials 104 to match the emission of the individual InGaN LEDs. As shown in FIG. 3B, the InGaN LED has an emission point 138 at about 478 nm. First and second converter materials 104 have a first converter emission point 139a and a second converter emission point 139b, respectively. Thus, the emission point 138 of the InGaN LED and the first and second converter emission points 139a and 139b form a triangle 142 that encompasses the black body emission point 136 for 4,000° K. As a result, the operator and/or the system 100 may combine the first and second converter materials 104 such that the combined emissions are at least approximate to the black body curve 134. In one embodiment, the combination of the first and second converter materials 104 may be determined empirically. In other embodiments, the ratio of the first and second converter materials 104 may be determined based on suitable color correction formula.

In any of the foregoing embodiments, the operator and/or the system 100 may adjust various parameters of the converter material 104 to match the emission of the individual InGaN LEDs. For example, in certain embodiments, the operator and/or the system 100 may adjust at least one of (1) a quantity of the converter material 104; (2) a mass, molar, or volume ratio of the converter materials 104; (3) a concentration of at least some of the converter materials 104.

Figure 4A:
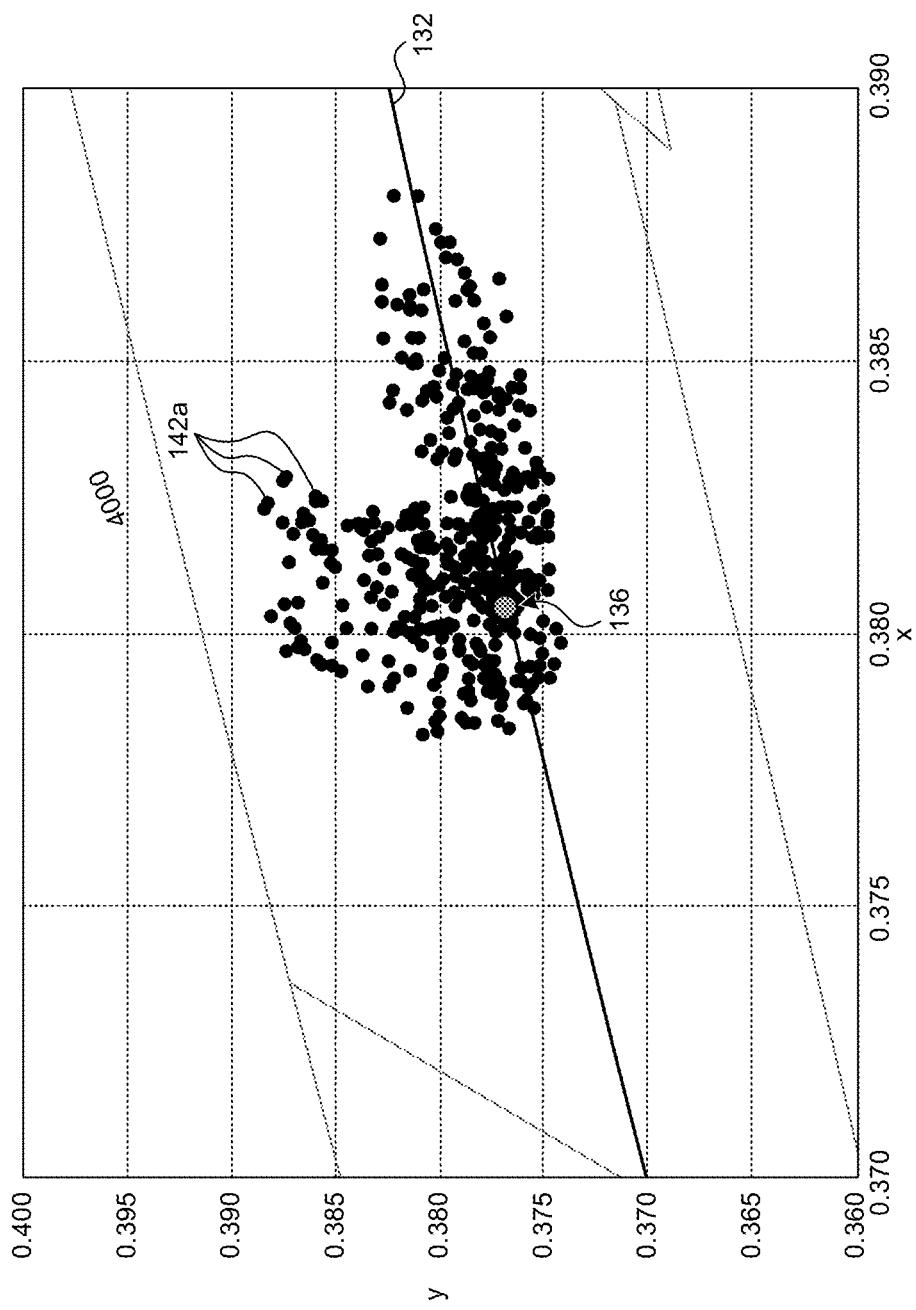
FIGS. 4A and 4B are enlarged partial chromaticity plots of combined emissions from an InGaN base material and phosphor(s) in accordance with conventional techniques and embodiments of the technology, respectively.
Figure 4B:
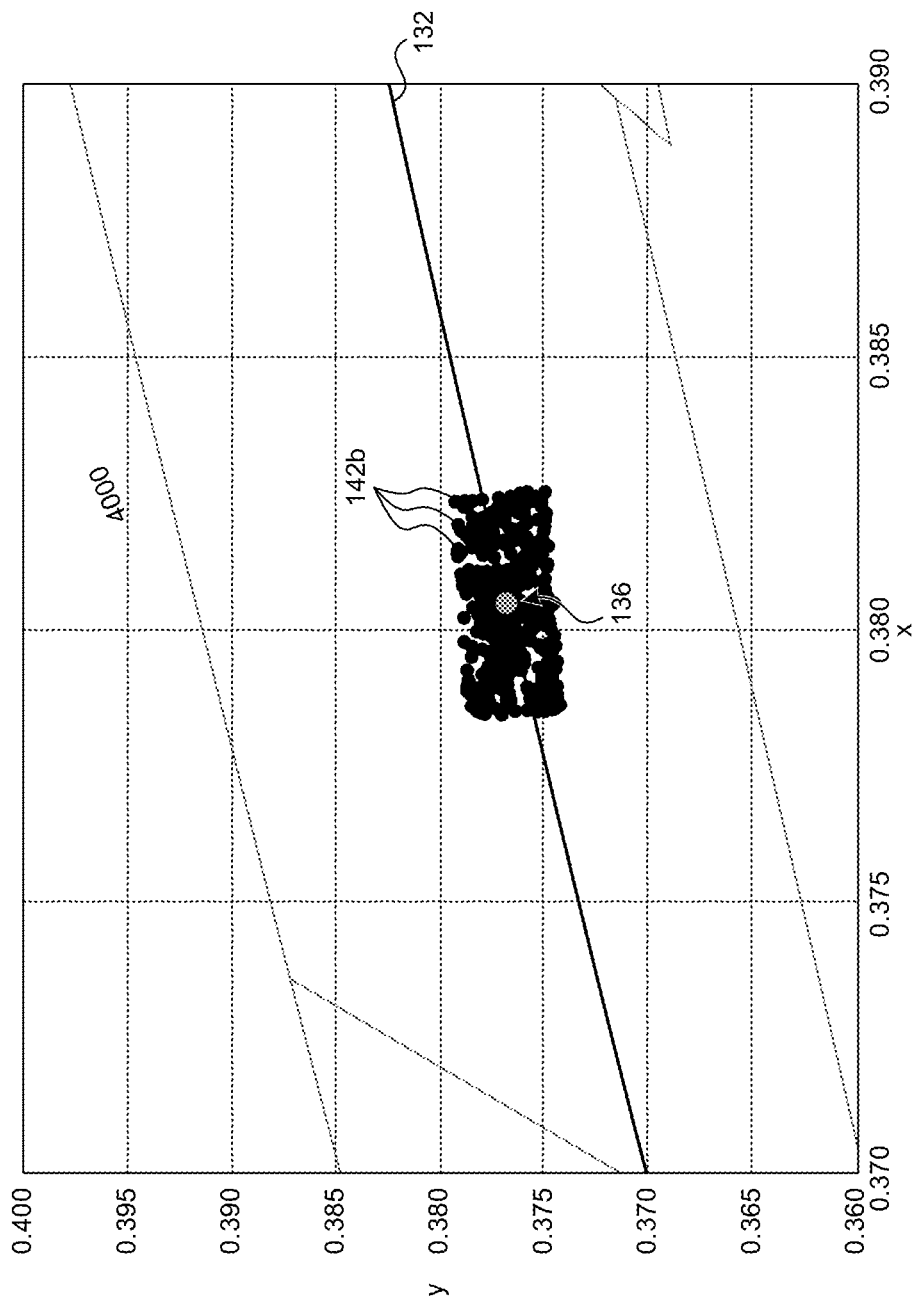

Simulation results of the microelectronic workpieces 114 (FIG. 1) processed according to conventional techniques and several embodiments of the system 100 are schematically illustrated in FIGS. 4A and 4B, respectively. As shown in FIG. 4A, applying the same converter material uniformly to the microelectronic devices 116 (FIG. 1) resulted in a large distribution of the combined emission points 142a. In contrast, as shown in FIG. 4B, selectively applying one or more converter materials 104 with the correct deposition parameters to corresponding areas of the microelectronic workpiece 114 in accordance with several embodiments of the system 100 resulted in a much smaller distribution of the combined emission points 142b than that in FIG. 4A. Thus, several embodiments of the system 100 can allow reduced off white color production when compared to conventional techniques.

Figure 5:
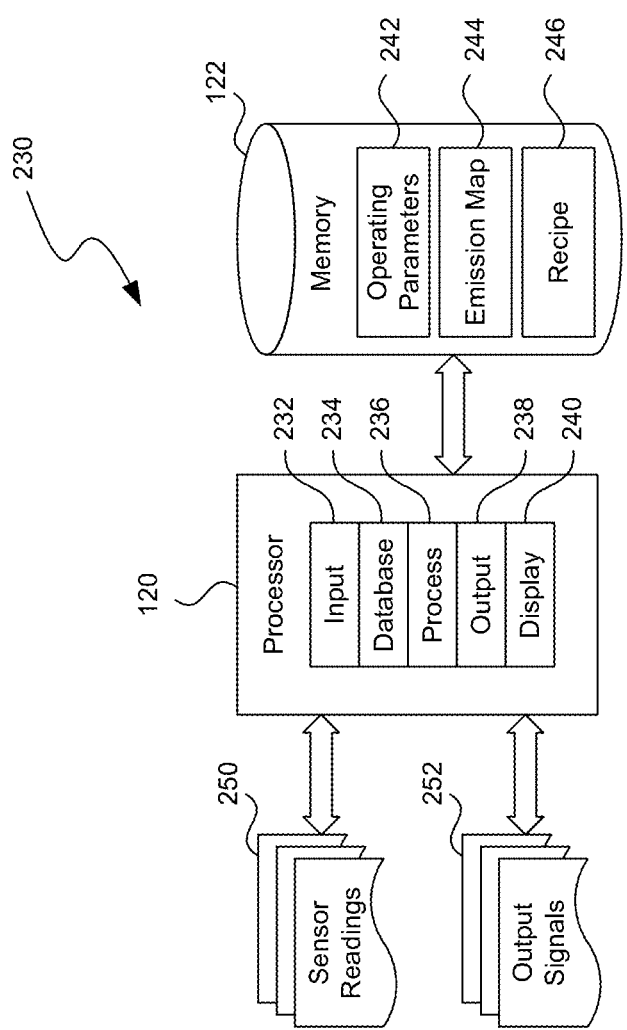
FIG. 5 is a block diagram showing computing system software modules suitable for the system of FIG. 1 in accordance with embodiments of the technology.

FIG. 5 is a block diagram showing computing system software modules 230 suitable for the controller 118 of FIG. 1 in accordance with embodiments of the technology. Each component may be a computer program, procedure, or process written as source code in a conventional programming language, such as the C++ programming language, and may be presented for execution by the processor 120 (FIG. 1) of the controller 118. The various implementations of the source code and object byte codes may be stored in the memory 122 (FIG. 1). The software modules 230 of the controller 118 may include an input module 232, a database module 234, a process module 236, an output module 238, and, optionally, a display module 240 interconnected with one another.

In operation, the input module 232 accepts an operator input, such as process setpoint (e.g., the target correlated color temperature) and control selections (e.g., selection for step mode or scanning mode), and communicates the accepted information or selections to other components for further processing. The database module 234 organizes records, including operating parameters 242, an emission map 244, a recipe database 246, and facilitates storing and retrieving of these records to and from the memory 122. The emission map 244 may include measured and/or derived emission parameters for the individual microelectronic devices 116, as described in more detail below with reference to FIGS. 6 and 7. Any type of database organization may be utilized, including a flat file system, hierarchical database, relational database, or distributed database, such as provided by a database vendor such as the Oracle Corporation, Redwood Shores, Calif.

The process module 236 generates control variables based on sensor readings 250 from sensors (e.g., external or integrated metrology tools) and/or other data sources, and the output module 238 generates output signals 252 based on the control variables. The processor 120 optionally may include the display module 240 for displaying, printing, or downloading the sensor readings 250, the output signals 252, and/or other information via a monitor, a printer, and/or other suitable device.

Figure 6:
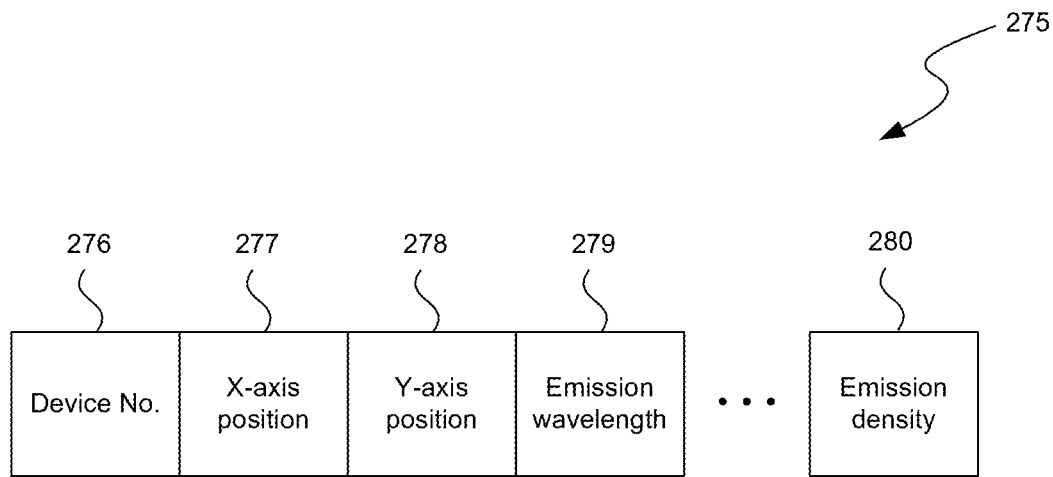
FIG. 6 is a database schema illustrating an organization of a color error record in accordance with embodiments of the technology.

FIG. 6 is a database schema illustrating an organization of the emission map 244 in the memory 122 of the controller 118 in FIG. 1. In the illustrated embodiment, only the information pertaining to the set of emission measurements is shown for purposes of clarity. For example, as shown in FIG. 6, an emission record 275 can include the following information: a device number 276, an X-position 277, a Y-position 278, an emission wavelength 279, and an emission density 280. In other embodiments, the emission record 275 can also include historical data and/or other pertinent data (not shown).

Figure 7:
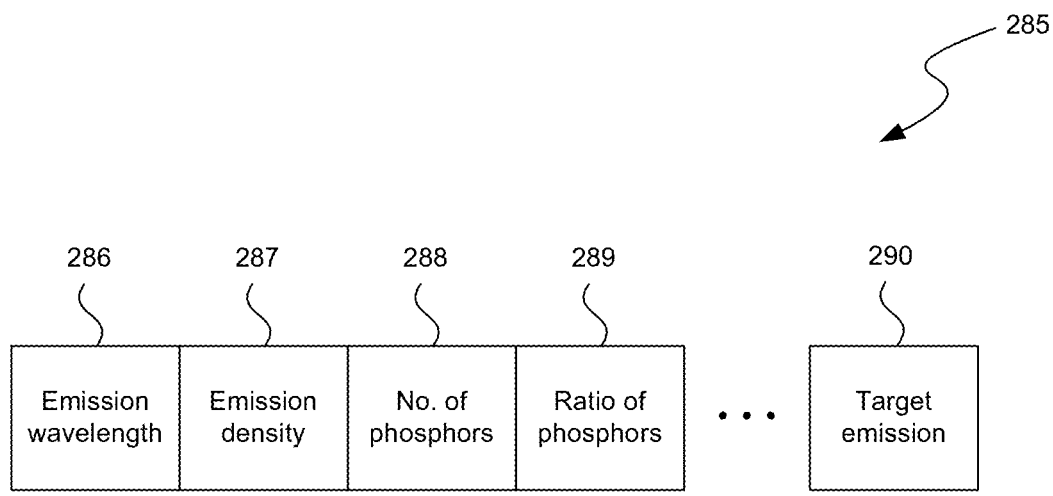
FIG. 7 is a database schema illustrating an organization of a recipe record in accordance with embodiments of the technology.

FIG. 7 is a database schema illustrating an organization of the recipe database 246 in the memory 122 of the controller 118 in FIG. 1. In the illustrated embodiment, the recipe database record 285 can include the following information: an emission wavelength of an LED 286, an emission density of an LED 287, number of phosphors 288, ratio of phosphors 289, and target emission wavelength 290. In other embodiments, the recipe database record 285 can also include historical data and/or other pertinent data (not shown).

Figure 8:
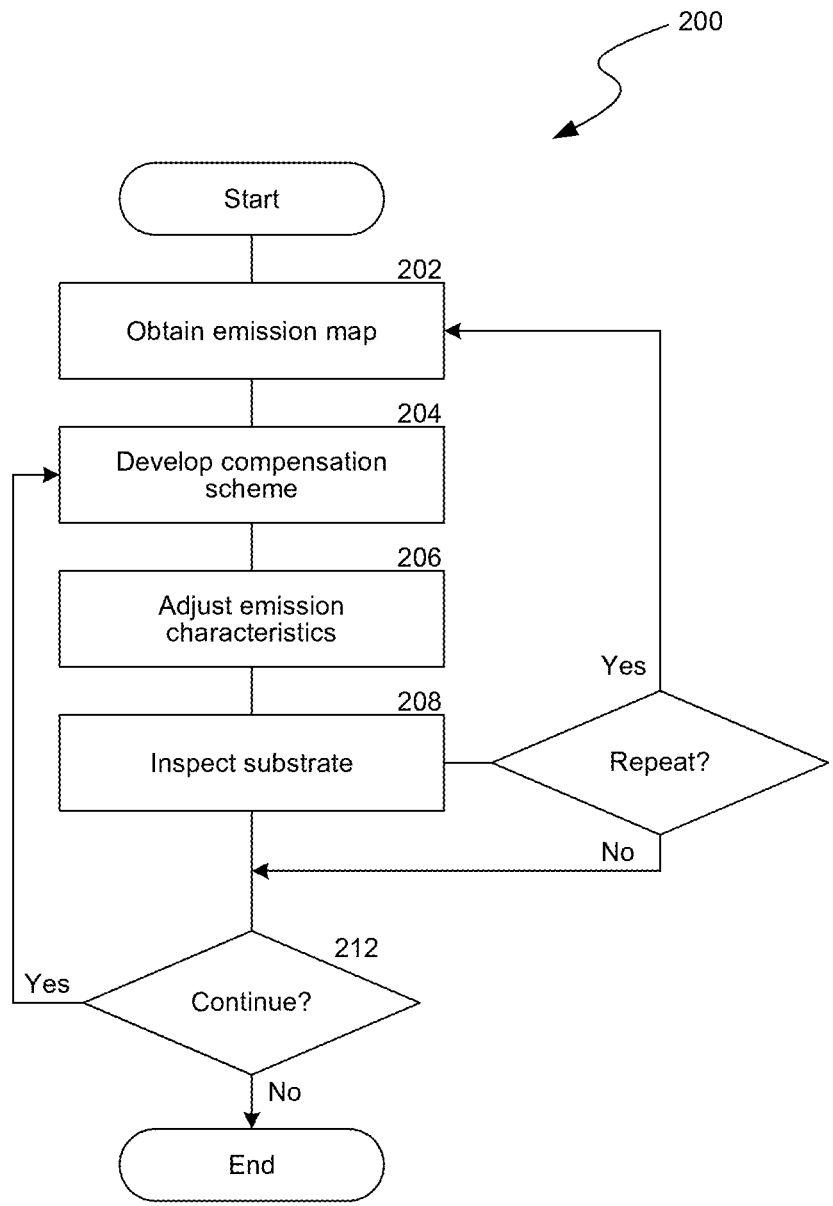
FIG. 8 is a flowchart showing a method for LED color correction in accordance with embodiments of the technology.

FIG. 8 is a flowchart showing a method 200 for correcting color errors in microelectronic devices in accordance with embodiments of the technology. As shown in FIG. 8, the method 200 includes obtaining an emission map of microelectronic devices on a substrate at stage 202. In one embodiment, obtaining the emission map can include measuring an emission wavelength, an emission density, and/or other emission parameters of at least some of the microelectronic devices with an electroluminescence and/or photoluminescence probe. The measured parameter can then be stored in a database for the corresponding microelectronic devices. In other embodiments, obtaining the emission map may include retrieving an emission map from a database. The retrieved emission map may be developed based on and/or otherwise derived from measurements of a previous substrate.

The method 200 can include developing compensation schemes based on emission map at stage 204. In one embodiment, developing the compensation schemes can include selecting at least one of a composition, a concentration, a quantity, and/or other parameters of a phosphor based on the emission parameters in the emission map and an operating temperature of the microelectronic device. In other embodiments, developing the compensation schemes can also include selecting two or more phosphors and empirically determining at least one of a mass, molar, volume composition, and/or other parameters of a phosphor based on the emission parameters in the emission map. In further embodiments, the compensation schemes may be determined in other suitable manner based on the emission parameters in the emission map.

The method 200 can also include adjusting emission characteristics of the microelectronic devices with the developed compensation schemes at stage 206. In one embodiment, adjusting emission characteristics can include injecting, printing, and/or otherwise introducing a phosphor based on the compensation schemes in an inkjet system. One suitable inkjet system is provided by Microfab Technologies, Inc., of Plano, Tex. In other embodiments, adjusting emission characteristics can also include depositing, installing, or forming microlenses and/or other color correction components on the microelectronic devices.

Optionally, the method 200 can include inspecting the microelectronic devices on the substrate at stage 208. A decision can be made to determine whether the combined emissions from the microelectronic devices are satisfactory (e.g., based on a variance threshold). In one embodiment, if an inspection indicates that the color errors are above a threshold, then the process reverts to obtaining emission map at stage 202; otherwise, the process may proceed. The method 200 can further include a decision stage 212 to determine whether the process should end. If yes, the process reverts to obtaining emission map at stage 202; otherwise, the process ends.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A non-transitory computer-readable medium containing a data structure, the data structure including:
    a base emission wavelength of a formed LED;
    a number of phosphors corresponding to the base emission wavelength, wherein a group of candidate phosphors is selected from the number of phosphors based on the base emission wavelength of the formed LED, and wherein the group of the candidate phosphors is selected based on a distribution area in a chromaticity plot, and wherein the group of the candidate phosphors together define a rectangular distribution area, and wherein the rectangular distribution area includes a plurality of points each indicative of a set of parameters associated with the number of phosphors; and
    a ratio of the number of phosphors.

2. The non-transitory computer-readable medium of claim 1, wherein the number of phosphors includes at least two phosphors.

3. The non-transitory computer-readable medium of claim 1, wherein the ratio includes a mass ratio.

4. The non-transitory computer-readable medium of claim 1, wherein the ratio includes a molar ratio.

5. The non-transitory computer-readable medium of claim 1, wherein the ratio includes a volume ratio.

6. The non-transitory computer-readable medium of claim 1, wherein the ratio is determined based on measured emission characteristic of the formed LED such that a combined emission from the formed LED and the phosphors based on the ratio at least approximates a white light.

7. The non-transitory computer-readable medium of claim 1, wherein the data structure includes a target emission of the formed LED.

8. The non-transitory computer-readable medium of claim 1, wherein the data structure includes an emission density of the formed LED.

9. The non-transitory computer-readable medium of claim 1, wherein the data structure includes a compensation scheme associated with the group of the candidate phosphors.

10. The non-transitory computer-readable medium of claim 9, wherein the compensation scheme includes a composition of the group of the candidate phosphors.

11. The non-transitory computer-readable medium of claim 9, wherein the compensation scheme includes a concentration of the group of the candidate phosphors.

12. The non-transitory computer-readable medium of claim 9, wherein the compensation scheme includes a quality of the group of the candidate phosphors.

13. The non-transitory computer-readable medium of claim 9, wherein the compensation scheme includes an operating temperature of the group of the candidate phosphors.

14. The non-transitory computer-readable medium of claim 1, wherein the base emission wavelength of the formed LED includes a peak wavelength.

15. The non-transitory computer-readable medium of claim 1, wherein the base emission wavelength of the formed LED includes a dominant wavelength.

16. A non-transitory computer-readable medium containing a data structure, the data structure including:
    a base emission wavelength of a formed LED;
    a number of phosphors corresponding to the base emission wavelength, wherein a group of candidate phosphors is selected from the number of phosphors based on the base emission wavelength of the formed LED, and wherein the group of the candidate phosphors is selected based on a distribution area in a chromaticity plot, and wherein the group of the candidate phosphors together define a rectangular distribution area, and wherein the rectangular distribution area includes a plurality of points each indicative of a set of parameters associated with the number of phosphors; and
    a compensation scheme associated with the group of the candidate phosphors.

17. The non-transitory computer-readable medium of claim 16, wherein the compensation scheme includes a composition of the group of the candidate phosphors.

18. The non-transitory computer-readable medium of claim 16, wherein the compensation scheme includes a concentration of the group of the candidate phosphors.

19. The non-transitory computer-readable medium of claim 16, wherein the compensation scheme includes a quality of the group of the candidate phosphors.

20. The non-transitory computer-readable medium of claim 16, wherein the compensation scheme includes an operating temperature of the group of the candidate phosphors.

21. A non-transitory computer-readable medium containing a data structure, the data structure including:
   a base emission wavelength of a formed LED;
   a number of phosphors corresponding to the base emission wavelength, wherein a group of candidate phosphors is selected from the number of phosphors based on the base emission wavelength of the formed LED, and wherein the group of the candidate phosphors is selected based on a distribution area in a chromaticity plot, and wherein the group of the candidate phosphors together define a rectangular distribution area, and wherein the rectangular distribution area includes a plurality of points each indicative of a set of parameters associated with the number of phosphors; and
   a target emission of the formed LED.

* * * * *